United States Patent [19]
Okunuki et al.

[11] Patent Number: 4,896,045
[45] Date of Patent: Jan. 23, 1990

[54] ELECTRON BEAM HEAD AND PATTERNING APPARATUS INCLUDING DETECTION OF SECONDARY OR REFLECTED ELECTRONS

[75] Inventors: Masahiko Okunuki, Tokyo; Mitsuaki Seki, Machida, both of Japan

[73] Assignee: Canon Kabushiki Kaisha, Tokyo, Japan

[21] Appl. No.: 186,966

[22] Filed: Apr. 27, 1988

[30] Foreign Application Priority Data

Apr. 28, 1987 [JP] Japan .................... 62-103025

[51] Int. Cl.$^4$ .............................................. G21K 5/10
[52] U.S. Cl. ............................. 250/492.2; 250/396 R; 250/397; 250/310
[58] Field of Search .................. 250/492.2, 492.3, 397, 250/396 R, 310

[56] References Cited

U.S. PATENT DOCUMENTS

| | | | |
|---|---|---|---|
| 4,259,678 | 3/1981 | van Gorkom et al. | 357/52 |
| 4,538,069 | 8/1985 | Shambroom et al. | 250/492.2 |
| 4,596,929 | 6/1986 | Coates et al. | 250/397 |
| 4,810,889 | 3/1989 | Yokomatsu et al. | 250/492.2 |

Primary Examiner—Carolyn E. Fields
Assistant Examiner—John A. Miller
Attorney, Agent, or Firm—Fitzpatrick, Cella, Harper & Scinto

[57] ABSTRACT

An electron beam head particularly suitably usable in an electron beam pattern drawing apparatus or otherwise is disclosed. The electron beam head includes an electron beam source and an electron beam detector which are provided on a common base member. Secondary electrons and/or reflected electrons caused when an electron beam emitted from the electron beam source impinges upon a workpiece or an object to be examined, are detected by the detector. These secondary electrons and/or reflected electrons can be efficiently collected and detected and, on the basis of which, the information concerning the position or otherwise related to the workpiece or the object to be examined can be detected precisely.

11 Claims, 3 Drawing Sheets

ELECTRON BEAM HEAD AND PATTERNING APPARATUS INCLUDING DETECTION OF SECONDARY OR REFLECTED ELECTRONS

FIELD OF THE INVENTION AND RELATED ART

This invention relates to an electron beam head particularly suitably usable in an electron beam pattern drawing apparatus for drawing a desired circuit pattern or otherwise on a workpiece such as a semiconductor wafer by use of an electron beam.

Electron beam pattern drawing apparatuses for use in the manufacture of semiconductor microcircuits, for example, include an electron beam emitting source. Conventional electron emitting sources utilize emission of thermoelectrons from a hot cathode. However, these types of electron emitting sources involve problems of a large loss in energy due to heating, the necessity of provision of heating means, and so on. In consideration of such inconveniences, studies have been made to develop an electron emitting source that does not rely on heating, but utilizes electron emission from a cold cathode, and various proposals and reports have been made. Examples of such an electron emitting source are as follows:

(1) An electron emitting element of the type that an inverse bias voltage is applied to a p-n junction to cause avalanche breakdown whereby electrons are emitted out of the element. This type of electron emitting element is disclosed in U.S. Pat. No. 4,259,678 and Japanese Laid-Open Patent Application, Laid-Open No. Sho54-111272.

(2) An MIM type electron emitting element wherein a layered structure of metal-insulator-metal is provided and wherein an electric voltage is applied between two metal layers, whereby electrons passed through the insulating layer due to the tunnel effect are emitted from the metal layer to the outside of the element.

(3) A surface conduction type electron emitting element wherein an electric voltage is applied to a high-resistance thin film in a direction perpendicular to the film direction, whereby electrons are emitted from the surface of the thin film to the outside of the element.

(4) A field-effect type (FE type) electron emitting element wherein an electric voltage is applied to a metal member having such a shape that easily causes the electric field concentration, so that a high-density electric field is produced locally whereby electrons are emitted from the metal member to the outside of the element.

Usually, in an electron beam pattern drawing apparatus, an alignment mark or marks provided for the alignment of a workpiece are detected by irradiating such an alignment mark with an electron beam and by detecting secondary electrons and/or reflected electrons which are generated as a result of the electron beam irradiation. For this purpose, one or more sensors or detectors are provided, separately from an electron beam head. More particularly, such a detector is disposed in the neighborhood of a workpiece (wafer), more specifically, at a position effective to assure good efficiency for the collection of secondary electrons or reflected electrons.

SUMMARY OF THE INVENTION

However, the inventors of the subject application have found that such separate provision of sensors or detectors as in conventional pattern drawing apparatuses involves the possibility of errors in relation to the mounting of sensors or detectors. Such an error easily prevents good detection accuracy. The present invention has been made to avoid such inconveniences.

Accordingly, it is an object of the present invention to provide a detecting system which is free from the above-described inconveniences.

It is another object of the present invention to provide an electron beam head which has a simple and compact structure, but which assures high-precision electron beam projection and, additionally, which assures precise detection of secondary electrons and/or reflected electrons.

Briefly, in accordance with one aspect of the present invention, to achieve at least one of these objects, there is provided an electron beam head having at least one electron beam producing source and at least one electron beam detecting means, wherein the electron beam producing source and the electron beam detecting means are provided integrally on a common base member.

In the electron beam head of the described form, the electron beam producing means which emits an electron beam and the electron beam detecting means operable to detect secondary electrons and/or reflected electrons caused as a result of the emission of the electron beam from the electron beam producing source, are held in a definite and fixed positional interrelation. Therefore, high-precision operation is possible. Further, since these elements are provided integrally on a common base member, the structure can be made simple and compact.

Further, the electron beam irradiating function and the electron beam detecting function of the electron beam head of the described form, can be selectively used in accordance with the need. Therefore, when the electron beam head of the described form is incorporated into a semiconductor microcircuit manufacturing exposure apparatus, the electron beam head can be used both for the alignment purpose, for aligning a semiconductor wafer, and for the exposure purpose for exposing the semiconductor wafer. This is effective to avoid the necessity of providing an additional radiation energy source for the alignment or exposure purpose and also to preclude the necessity of movement of some components, such as a light source, relative to the wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
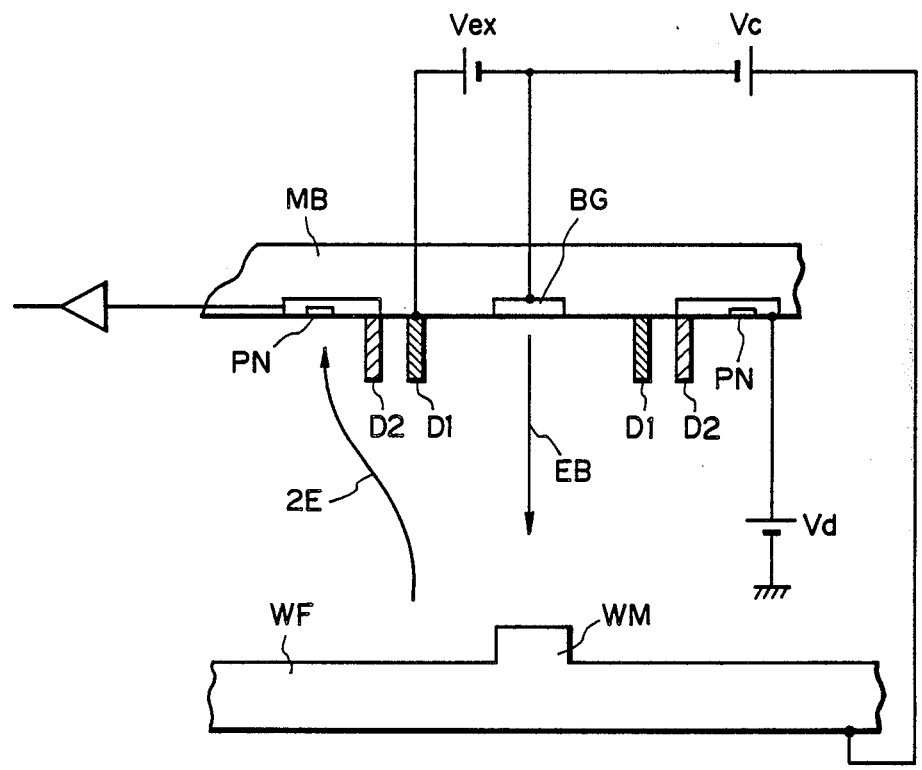
FIG. 1 is a fragmentary and schematic view of an electron beam head according to an embodiment of the present invention, wherein the electron beam head is applied to the exposure of a semiconductor wafer.

Referring first to FIG. 1, there is shown an electron beam head according to an embodiment of the present invention, wherein the electron beam head is incorporated into an exposure apparatus for exposing a semiconductor wafer.

In FIG. 1, reference character WF denotes a semiconductor wafer which is going to be exposed to an electron beam EB produced by an electron beam producing source BG. As for the electron beam producing source BG, an electron emitting element, e.g., of a type wherein avalanche breakdown is caused and electrons are emitted thereby, such as disclosed in the aforementioned U.S. Pat. No. 4,259,678 or in the aforementioned Japanese Laid-Open Patent Application, Laid-Open No. Sho54-111272, may be used. In this embodiment, in any case, the electron beam producing source BG comprises an electron emitting element of a type wherein emission of electrons from a cold cathode is utilized. Such an electron emitting element can be easily and precisely formed on a base member, which will be described below, by use of conventional semiconductor technology.

The electron beam head of the present embodiment comprises a single base plate MB on which at least one electron beam producing source BG is provided. In this embodiment, as shown in FIG. 1, the electron beam producing source BG is embedded in the base member MB. As for the base member MB, a plate-like member made of glass, semiconductor or otherwise, as disclosed in the aforementioned Japanese Laid-Open Patent Application, Laid-Open No. Sho54-111272 or Japanese Laid-Open Patent Application, Laid-Open No. Sho56-15529, may be used.

While not shown in the drawings, the electron beam head of the present embodiment is provided with a beam deflecting electrode which is formed on the bottom surface of the base member MB as a unit therewith and in the neighborhood of the source BG. The position of the unshown deflecting electrode is such that the deflecting electrode can deflect the electron beam produced by the electron beam producing source BG, efficiently in each of the X and Y directions.

The electron beam head of the present embodiment is usable to detect an alignment mark WM formed on the wafer WF. The detection of such a wafer mark WM is made at the base member MB side. More specifically, an electron beam EB is projected from the electron beam producing source BG upon the wafer mark WM. As the wafer mark WM is irradiated with the electron beam EB, secondary electrons and/or reflected electrons as denoted at 2E in FIG. 1 are produced from the wafer WF. These secondary electrons or reflected electrons are received by one or more sensors PN, such as a p-n junction, for example, which are formed on the base member MB as a unit therewith. By this, the wafer mark WM is detected.

Preferably, the position of the sensor on the base member MB is such that the sensor can efficiently detect secondary electrons or reflected electrons 2E. Moreover, in the present embodiment, ring-like electrodes D1 and D2 are mounted on the base member MB side in order to further improve the efficiency of the electron detection. Additionally, an electric voltage Vex is applied between the electrode D1 and the electron beam producing source BG; an electric voltage Vd is applied to the electrode D2; and an acceleration electric voltage Vc is applied between the electron beam producing means BG and the wafer WF, as illustrated in FIG. 1.

Accordingly, when electric voltages (for example, Vex = 10 –100 V; Vc = 1 –10 KV; and Vd = 100 V) are applied, secondary electrons or reflected electrons 2E are efficiently collected and detected by the p-n junction sensor PN.

The sensor means for detecting secondary electrons or reflected electrons may comprise a photosensor or an electron sensor and, as described hereinbefore, a p-n junction may be used. Further, a pair of sensors may be used and disposed in a symmetrical manner with respect to the X direction or the Y direction. Alternatively, two pairs of sensor may be used, each pair being disposed along the X or Y direction. The sensors may be disposed along a circle. Of course, an integral ring-like sensor may be used.

Where paired sensors are used, the signals from the paired sensors may be balanced and then combined. Such signal processing is preferable because adverse affects of noise or otherwise can be minimized.

Figure 2:
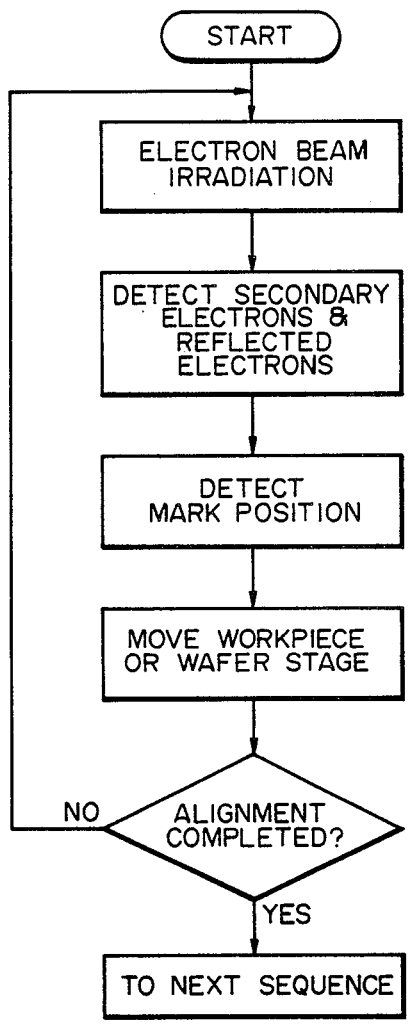
FIG. 2 is a flow chart showing the sequence of alignment control made by use of the electron beam head according to the FIG. 1 embodiment of the present invention.

Referring now to FIG. 2, description will be made of an example of the control of the electron beam head of the FIG. 1 embodiment. FIG. 2 is a flow chart showing the sequence of the alignment control in a case where the electron beam head of the FIG. 1 embodiment is used for detecting the position of a semiconductor wafer.

The electron beam EB emitted from the electron beam producing source BG is deflected by means of the unshown deflecting electrode so that the wafer mark WM formed on the wafer WF is scanned by the deflected electron beam. Secondary electrons and reflected electrons caused as a result of the irradiation of the wafer mark WM with the electron beam are picked up by the sensor PN. As the electron beam scans the edges of the wafer mark WM, the sensor PN produces distinctive output signals which can be discriminated from output signals when the electron beam scans a flat surface portion of the wafer, other than the edge of the wafer mark WM. From the thus detected distinctive output signals and from the angle of deflection of the electron beam, the position of the wafer mark WM can be detected. In accordance with the thus detected positional information, concerning the wafer mark WM, a wafer stage (not shown) holding the wafer WF and/or the base member MB of the electron beam head is driven and displaced so that the wafer WF is aligned with respect to the electron beam head or any other reference.

Figure 3:
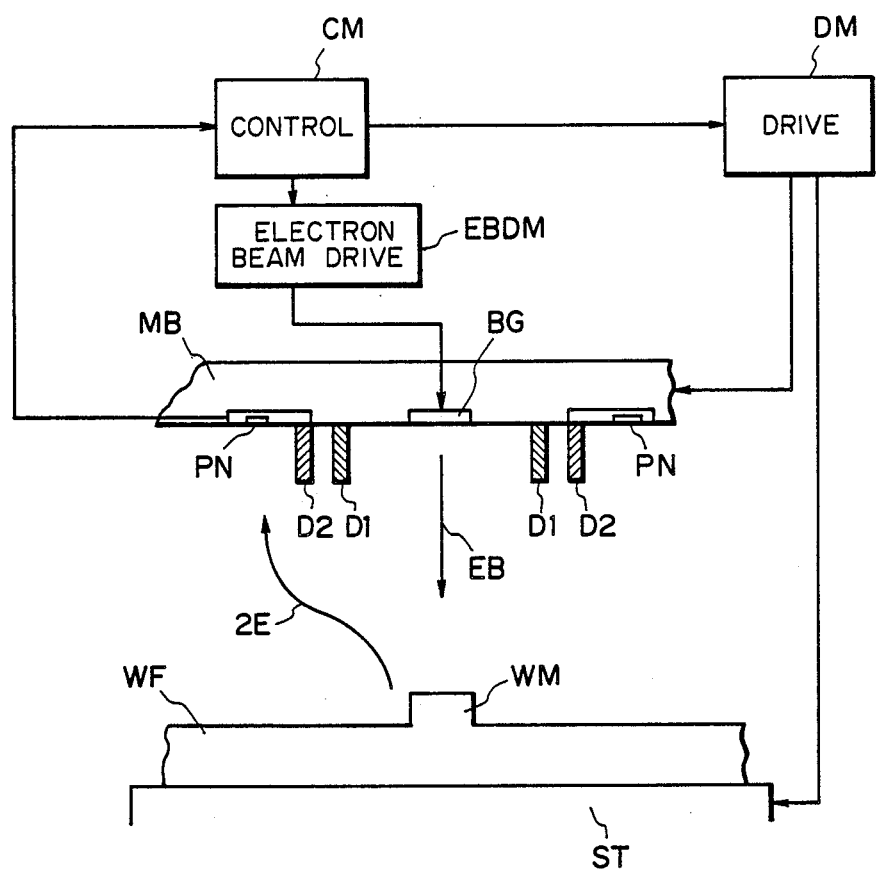
FIG. 3 is a fragmentary and schematic view of an electron beam head according to another embodiment of the present invention, wherein the electron beam head is incorporated into a semiconductor microcircuit manufacturing exposure apparatus.

Referring now to FIG. 3, there is shown an electron beam head according to another embodiment of the present invention, wherein the electron beam head is incorporated into an exposure apparatus for exposing a semiconductor wafer. Same reference characters as of the FIG. 1 embodiment are assigned to a similar or corresponding element.

As shown in FIG. 3, the exposure apparatus includes a control means CM; a driving means DM which is effective to displace a wafer stage ST and/or a base member MB of the electron beam head; and a selection and drive means EBDM operable in accordance with instruction signals supplied thereto from the control means CM, to selectively drive an electron beam producing source BG so that the same is selectively used for the alignment purpose and for the pattern drawing purpose.

When the electron beam producing source BG is used for the alignment purpose, the selection and drive means EBDM drives the electron beam producing source BG to cause it to produce an electron beam EB which is projected upon the wafer WF surface, whereby secondary electrons and reflected electrons 2E are produced. The thus produced secondary electrons or reflected electrons 2E are efficiently attracted and collected by the structure such as described with reference to FIG. 1 and then are detected by the sensor PN. The output signal of the sensor PN is supplied to the control means CM, in which the detected signal is transformed into the information concerning the position of the wafer (wafer mark). Then, the control means CM supplies an instruction signal to the drive means DM, whereby the latter operates in response to the instruction signal to drive and displace at least one of the wafer stage ST and the base member MB. By this, the wafer alignment is accomplished.

When the electron beam producing source BM is used for the pattern drawing, the selection and drive means EBDM controllably drives the electron beam producing source BG so that it is actuated and then deactuated, as desired, in accordance with a pattern to be drawn on the wafer WF. By this, a desired pattern can be drawn on the wafer WF by the exposure using the electron beam from the electron beam producing means BG.

The selective use of the electron beam producing means BG, described above, is conducted under the influence of the control means CM.

It should be noted that the present invention is applicable not only to the printing (drawing) of a semiconductor circuit pattern using an electron beam, but also to the data writing upon a recording member which uses an electron-beam sensitive medium. Also, the present invention is applicable to the reading of such data when the invention is used in combination with a charged-particle sensor.

More particularly, for example, the present invention is applicable to the recording or tracking in the field of a magneto-optic recording medium such as an optical disk or an optical card, or a microfilm, and in such a case, the electron beam head of the present invention is selectively usable for the data writing and the data reading.

Further, the electron beam head of the present invention is applicable to an electron-beam probe tester for the examination of the function of semiconductor devices. In such a case, an appropriate electron beam producing source may be selected in accordance with the size of a semiconductor chip or with the point of measurement. At this time, the remainder other than the electron beam producing source selected for the measurement may be kept in a state wherein production of signals is inhibited.

When the electron beam head of the present invention is incorporated in a particular apparatus for plural uses, the output energy of the electron beam head as a whole may be variably controlled for each use. Further, the output energy of each electron beam producing source may be variably controlled. This is easily attainable and may be preferably incorporated into the embodiments described hereinbefore.

In accordance with the present invention, as described hereinbefore, electron beam producing means and electron beam detecting means are provided integrally on a common base member. Accordingly, the structure can be made simple and compact and, additionally, the precision can be improved significantly.

Further, the electron beam irradiating function and the electron beam detecting function can be selectively used in accordance with the need. Therefore, the electron beam head of the present invention is suitably usable both for the alignment purpose and the exposure purpose when the head is incorporated into an alignment and exposure apparatus for exposing a semiconductor wafer. This is very effective to avoid the necessity of moving some components such as an additional light source relative to a wafer. Further, the necessity of an additional radiation source, such as a light source, is avoided. Further, the problem of creation of dust or foreign particles can be avoided.

Moreover, the electron beam detecting means can be provided in close proximity to the electron beam producing means. This is very effective for the detection of secondary electrons or reflected electrons.

While the invention has been described with reference to the structures disclosed herein, it is not confined to the details set forth and this application is intended to cover such modifications or changes as may come within the purposes of the improvements or the scope of the following claims.

What is claimed is:

1. An electron beam head for projecting an electron beam toward an article, comprising:
   a base member;
   electron beam producing means provided on said base member, for producing a beam of electrons;
   detecting means provided on said base member, for detecting electrons from the article as the article is irradiated with the electron beam from said electron beam producing means;
   a first electrode provided on said base member, for providing a first electric field having a first potential for introducing the electrons from the article to said detecting means; and
   a second electrode provided on said base member and disposed between said electron beam producing means and said first electrode, for providing a second electric field having a potential higher than that of the first potential.

2. An electron beam head according to claim 1, wherein said detecting means detects secondary electrons from the article.

3. An electron beam head according to claim 1, wherein said detecting means detects electrons reflected from the article.

4. An electron beam head according to claim 1, wherein said electron beam producing means comprises a cold cathode.

5. An electrode beam head according to claim 1, wherein said detecting means comprises a p-n junction.

6. A patterning apparatus for patterning a workpiece having a surface sensitive material layer by use of an electron beam, said apparatus comprising:
   a base member;
   electron beam producing means provided on said base member, for producing a beam of electrons;
   detecting means provided on said base member, for detecting electrons from the workpiece as the workpiece is irradiated with the electron beam from said electron beam producing means;

a first electrode provided on said base member, for providing a first electric field having a first potential for introducing the electrons from the workpiece to said detecting means; and a second electrode provided on said base member and disposed between said electron beam producing means and said first electrode, for providing a second electric field having a potential higher than that of the first potential.

7. An apparatus according to claim 6, wherein said detecting means detects secondary electrons from the article.

8. An apparatus according to claim 6, wherein said detecting means detects electrons reflected from the article.

9. An apparatus according to claim 6, wherein said electron beam producing means comprises a cold cathode.

10. An apparatus according to claim 6, wherein said detecting means comprises a p-n junction.

11. An apparatus according to claim 6, further comprising means for accelerating the electron beam from said electron beam producing means.

* * * * *

UNITED STATES PATENT AND TRADEMARK OFFICE
CERTIFICATE OF CORRECTION

PATENT NO. : 4,896,045
DATED : January 23, 1990
INVENTOR(S) : Masahiko Okunuki et al.

It is certified that error appears in the above-identified patent and that said Letters Patent is hereby corrected as shown below:

COLUMN 1

Line 33, "Sho54-111272." should read --Sho 54-111272.--.
Line 49, "locally" should read --locally,--.

COLUMN 3

Line 18, "No.Sho54-111272," should read --No. Sho 54-111272,--.
Line 34, "Sho54-111272" should read --Sho 54-111272--.
Line 35, "Sho56-" should read --Sho 56- --.

COLUMN 6

Line 57, "electrode beam head" should read --electron beam head--.

Signed and Sealed this

Ninth Day of April, 1991

*Attest:*

HARRY F. MANBECK, JR.

*Attesting Officer*     *Commissioner of Patents and Trademarks*